US012685199B2

(12) United States Patent　　　　(10) Patent No.: US 12,685,199 B2
Sahoo et al.　　　　　　　　　　　　(45) Date of Patent: Jul. 14, 2026

(54) SYSTEMS AND METHODS FOR FABRICATING A 2D-MATERIAL-BASED QUANTUM SENSOR CHIP

(71) Applicant: Toyota Motor Engineering & Manufacturing North America, Inc., Plano, TX (US)

(72) Inventors: Biswajit Sahoo, La Jolla, CA (US); Alejandro Ruiz, Ann Arbor, MI (US); Songtao Wu, Ann Arbor, MI (US); Debasish Banerjee, Ann Arbor, MI (US)

(73) Assignees: TOYOTA MOTOR ENGINEERING & MANUFACTURING NORTH AMERICA, INC., Plano, TX (US); TOYOTA JIDOSHA KABUSHIKI KAISHA, Toyota (JP)

( * ) Notice: Subject to any disclaimer, the term of this patent is extended or adjusted under 35 U.S.C. 154(b) by 410 days.

(21) Appl. No.: 18/325,705

(22) Filed: May 30, 2023

(65) Prior Publication Data

US 2024/0402263 A1　　Dec. 5, 2024

(51) Int. Cl.
　　*G01R 33/00*　　　(2006.01)
　　*H10P 50/00*　　　(2026.01)
　　　　(Continued)

(52) U.S. Cl.
　　CPC ...... *H10W 70/685* (2026.01); *G01R 33/0047* (2013.01); *G01R 33/0052* (2013.01);
　　　　(Continued)

(58) Field of Classification Search
　　CPC ........... H01L 23/49822; H01L 21/302; G01R 33/0047; G01R 33/0052; G01R 33/0076;
　　　　(Continued)

(56) References Cited

U.S. PATENT DOCUMENTS

2011/0073562 A1 *　3/2011　Zettl ..................... C01B 21/064
　　　　　　　　　　　　　　　　　　　216/36
2022/0082639 A1　　3/2022　Kim et al.
　　　　(Continued)

OTHER PUBLICATIONS

Lee, Dongryul et al "High-energy proton irradiation damage on two-dimensional hexagonal boron nitride" RSC Adv., 2019, 9, 18326-32, published Jun. 11, 2019. (Year: 2019).*
(Continued)

*Primary Examiner* — Anita K Alanko
(74) *Attorney, Agent, or Firm* — Jordan IP Law, LLC

(57)　　　　ABSTRACT

A method, computer program product, and sensory chip for use as a quantum magnetometer. A silicon-based material may be coated with a first metal material and a second metal material to create a substrate. A multi-layer hexagonal boron nitride (h-BN) may be transferred onto the substrate. A protective film may be coated on a layer of the multi-layer h-BN. The layer of the multi-layer h-BN may be irradiated for defect generation in the layer of the multi-layer h-BN. An active region of the substrate may be etched. Resist of the substrate may be removed. Contact pads may be created for the substrate. A layer of the first metal material and the second metal material may be coated on the substrate. Additional resist of the substrate may be removed. The substrate may be cut into a plurality of smaller substrates, wherein each smaller substrate of the plurality of smaller substrates includes a h-BN based quantum magnetometer.

7 Claims, 15 Drawing Sheets

(51) Int. Cl.
H10W 70/685 (2026.01)
*B81C 1/00* (2006.01)
*H05K 3/02* (2006.01)

(52) U.S. Cl.
CPC .......... *G01R 33/0076* (2013.01); *H10P 50/00* (2026.01); *B81C 1/00071* (2013.01); *B81C 1/00246* (2013.01); *B81C 1/00523* (2013.01); *B81C 2201/0191* (2013.01); *B81C 2201/0195* (2013.01); *B81C 2203/051* (2013.01); *H05K 3/025* (2013.01)

(58) Field of Classification Search
CPC ............ B81C 1/00071; B81C 1/00246; B81C 1/00523; B81C 2201/0191; B81C 2201/0195; B81C 2203/051; H05K 3/025; H10W 70/685; H10P 50/00
See application file for complete search history.

(56) References Cited

U.S. PATENT DOCUMENTS

| | | | |
|---|---|---|---|
| 2024/0130248 A1* | 4/2024 | Glass | H10D 30/01 |
| 2024/0402264 A1* | 12/2024 | Sahoo | G01R 33/0052 |
| 2024/0402270 A1* | 12/2024 | Sahoo | G01R 33/0052 |

OTHER PUBLICATIONS

Gao, X. et al, "High-Contrast Plasmonic-Enhanced Shallow Spin Defects in Hexagonal Boron Nitride for Quantum Sensing" Nano Letters, 21 (18) Sep. 2, 2021. (Year: 2021).*
Gao, X. et al, "Supporting Information: High-Contrast Plasmonic-Enhanced Shallow Spin Defects in Hexagonal Boron Nitride for Quantum Sensing" Nano Letters, 21 (18) Sep. 2, 2021, supporting information available online, https://pubs.acs.org/doi/10.1021/acs.nanolett.1c02495. (Year: 2021).*
Nyugen et al., "Nanoassembly of Hexagonal Boron Nitride and Gold Nanospheres", 2007, 8 pages.
Proscia et al., "Near-Deterministic Activation of Room-Temperature Quantum Emitters in Hexagonal Boron Nitride", Sep. 14, 2018, 8 pages.
Lyu et al., "Strain Quantum Sensing with Spin Defects in Hexagonal Boron Nitride", 2022, 7 pages.
Toth et al., "Single Photon Sources in Atomically Thin Materials", Feb. 8, 2019, 22 pages.
Rajesh Uppal, "Quantum sensors like quantum magnetometers entering commercial market to detect and measure extremely small signals", May 9, 2021, 16 pages.
Kern et al, Nanoscale Positioning of Single-Photon Emitters in Atomically Thin WSe2, Jun. 15, 2016, 8 pages.

* cited by examiner

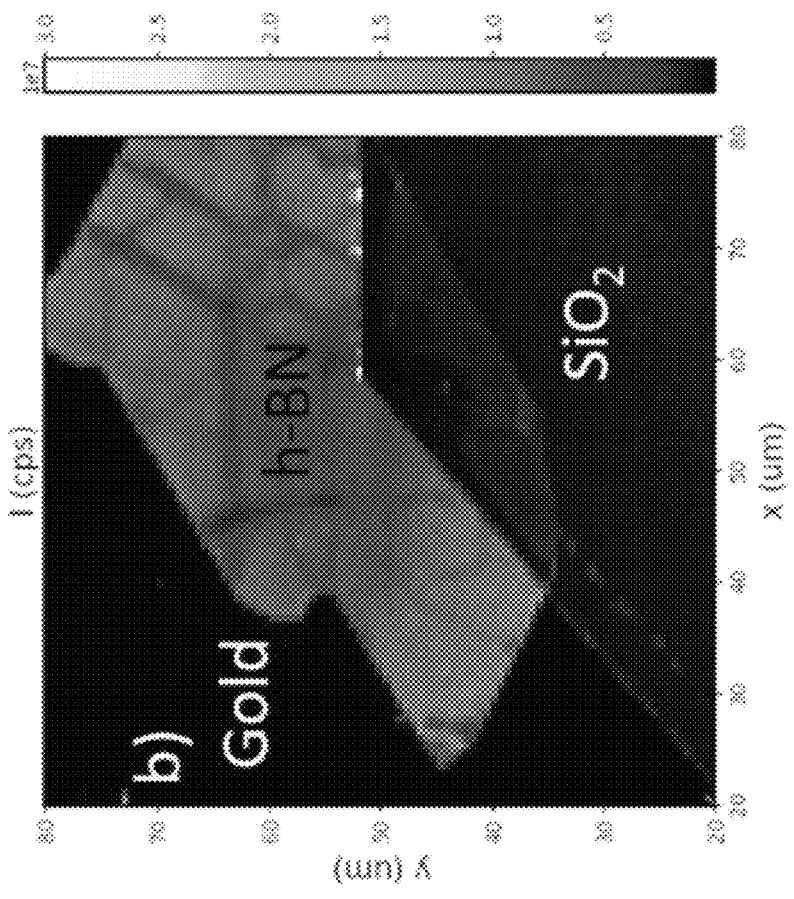
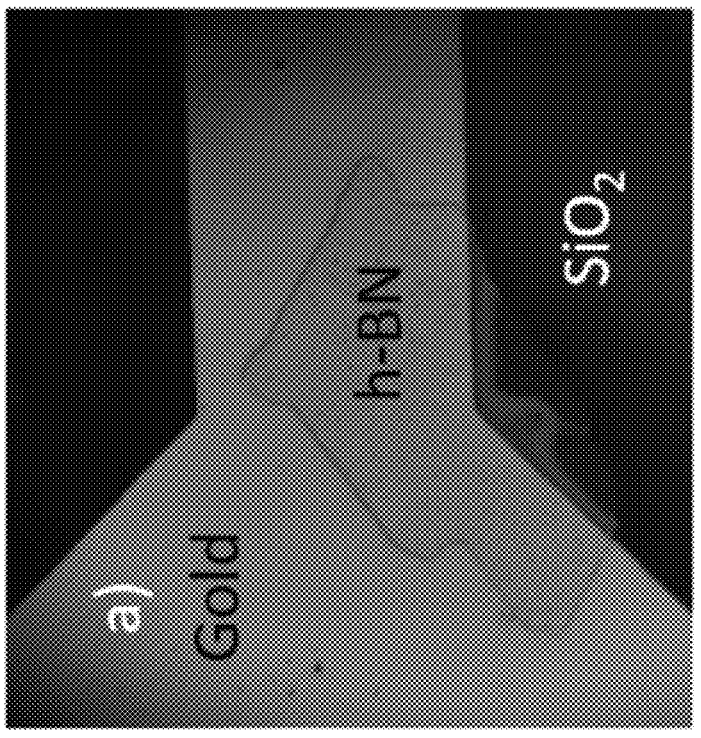
FIG. 3

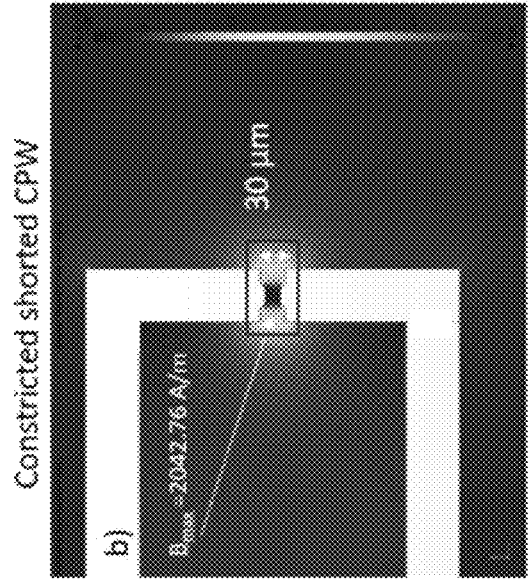
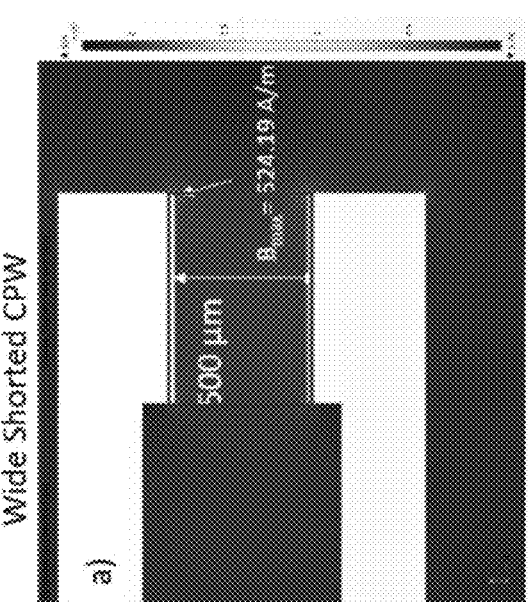
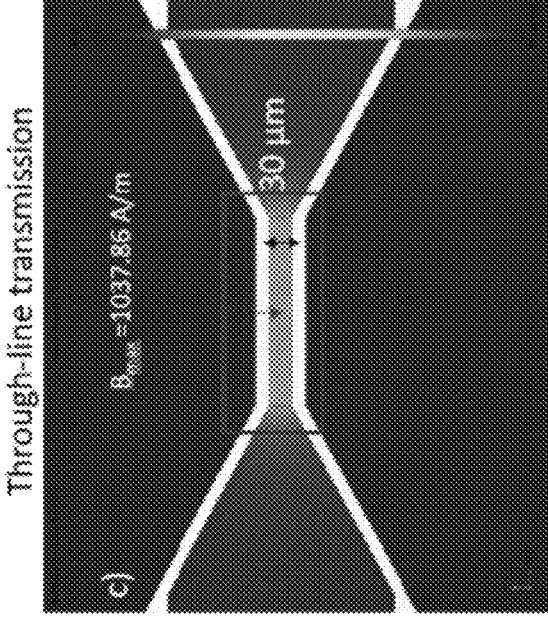
500
FIG. 5

600

10

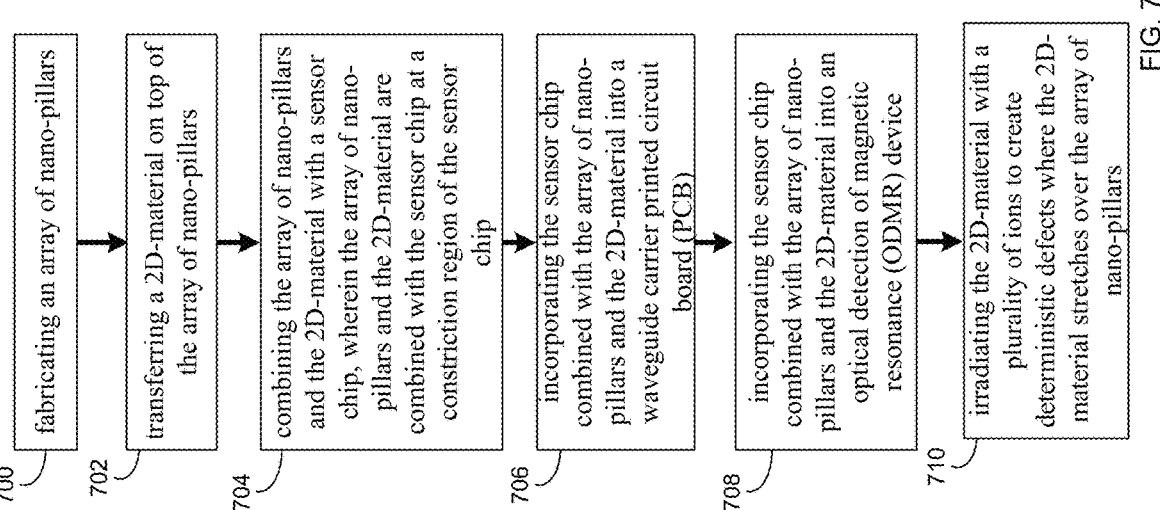

700 fabricating an array of nano-pillars 702 transferring a 2D-material on top of the array of nano-pillars 704 combining the array of nano-pillars and the 2D-material with a sensor chip, wherein the array of nano-pillars and the 2D-material are combined with the sensor chip at a constriction region of the sensor chip 706 incorporating the sensor chip combined with the array of nano-pillars and the 2D-material into a waveguide carrier printed circuit board (PCB)

708 incorporating the sensor chip combined with the array of nano-pillars and the 2D-material into an optical detection of magnetic resonance (ODMR) device 710 irradiating the 2D-material with a plurality of ions to create deterministic defects where the 2D-material stretches over the array of nano-pillars

FIG. 7

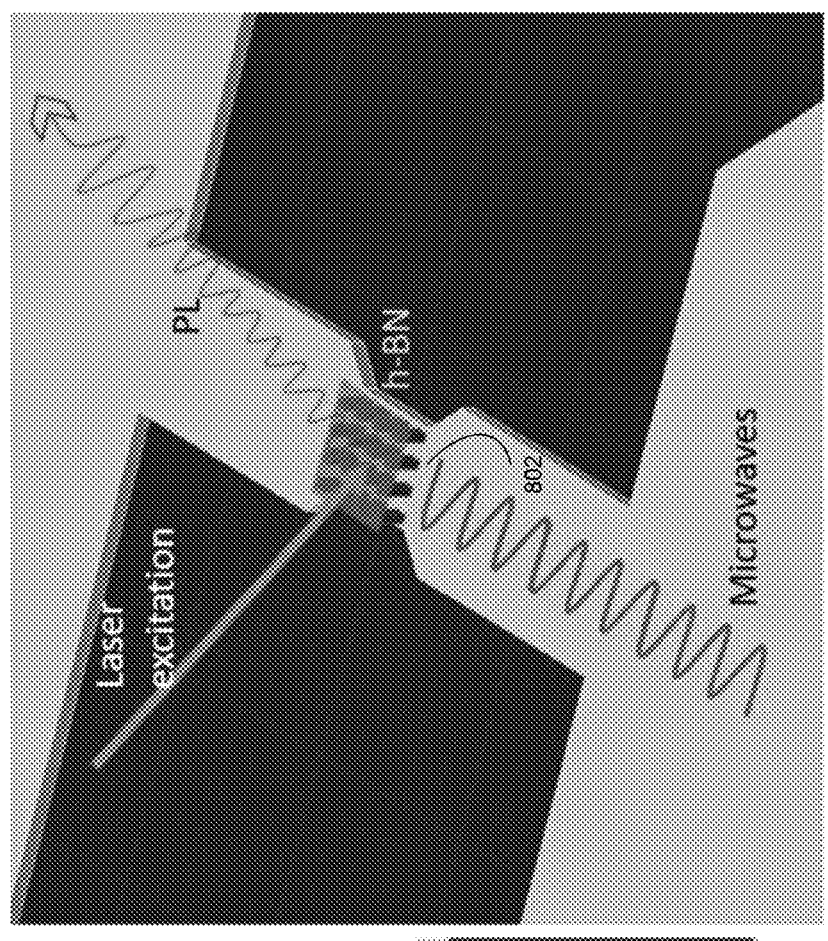
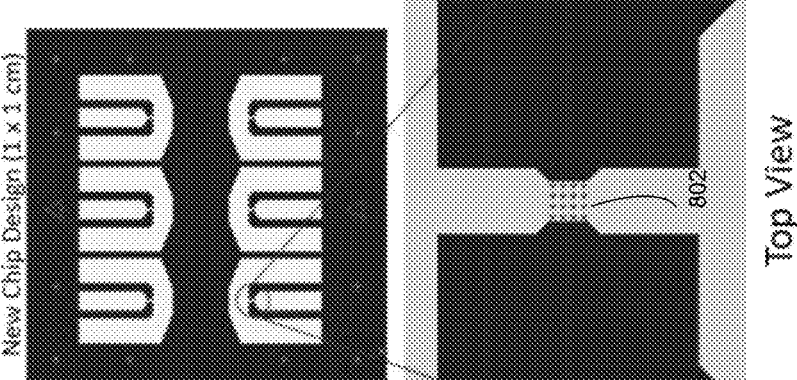
800
FIG. 8

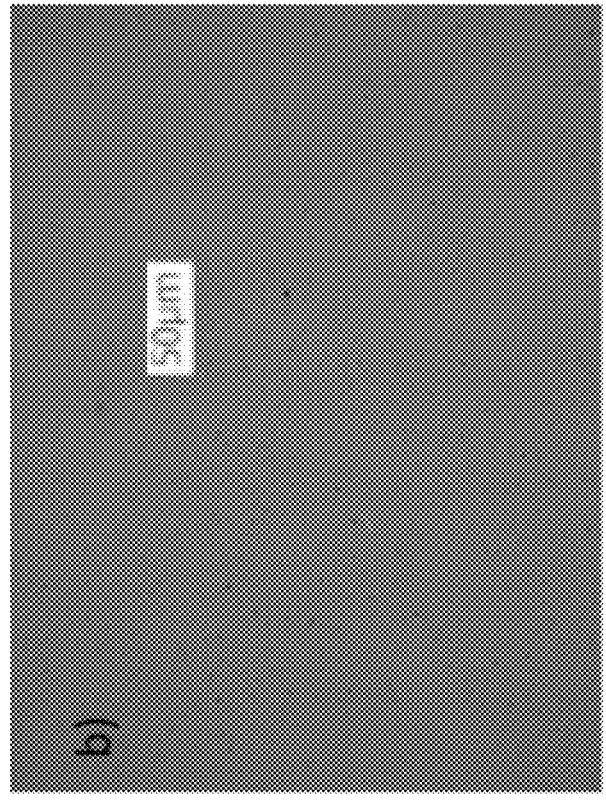
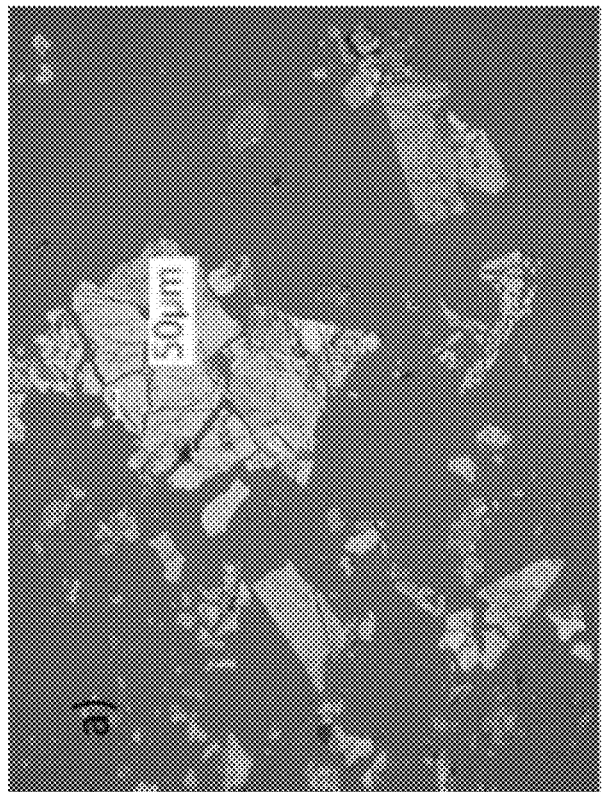
FIG. 12

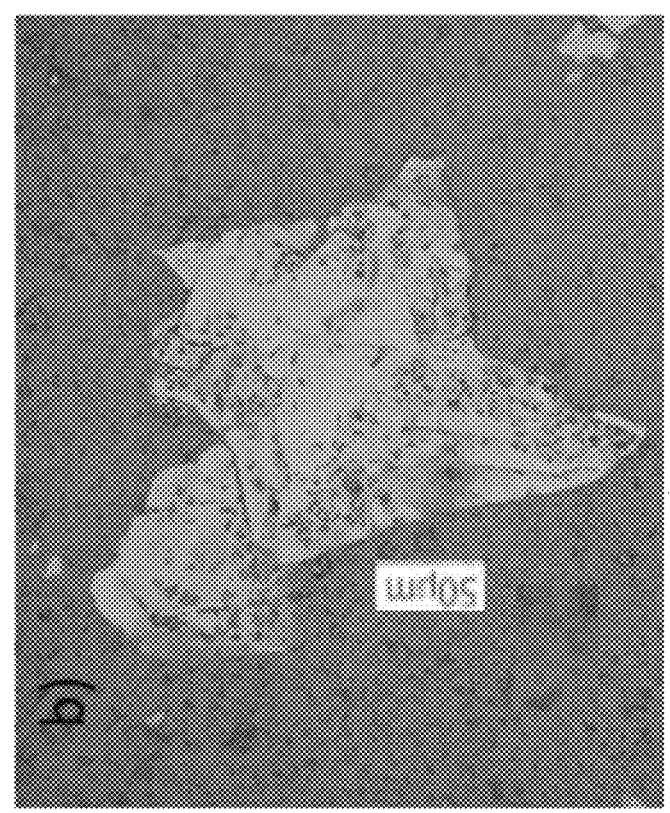
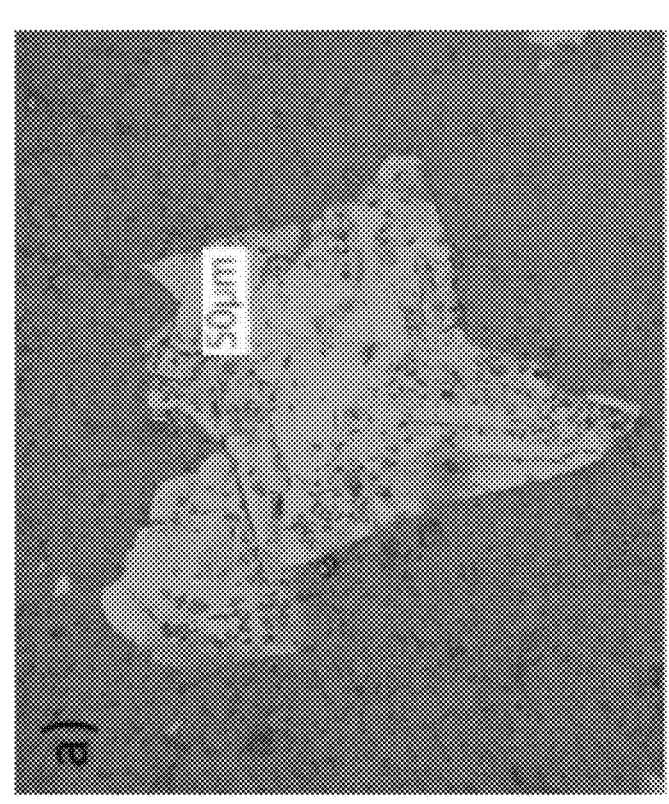
FIG. 13 a)
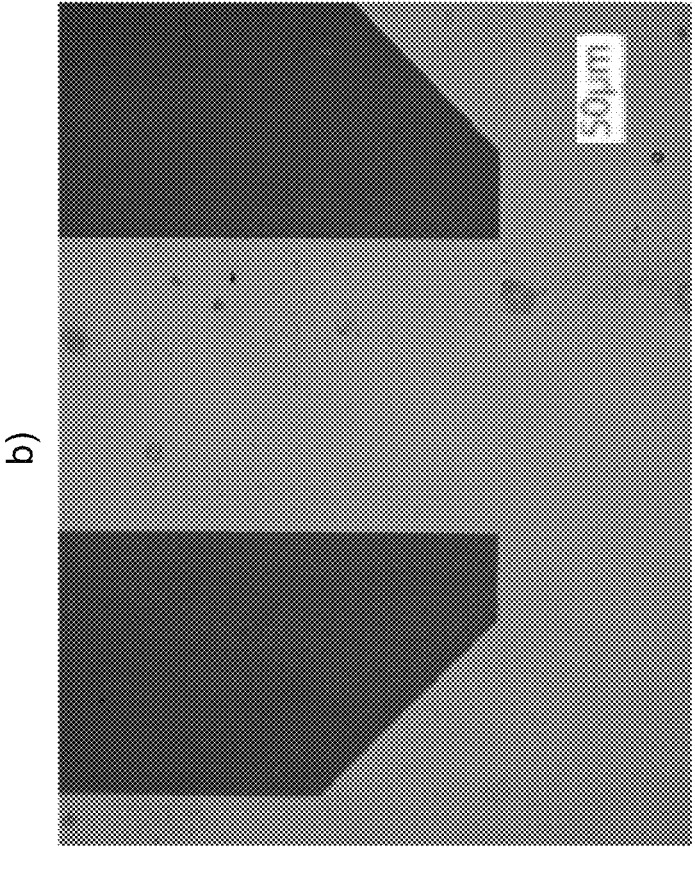
b)
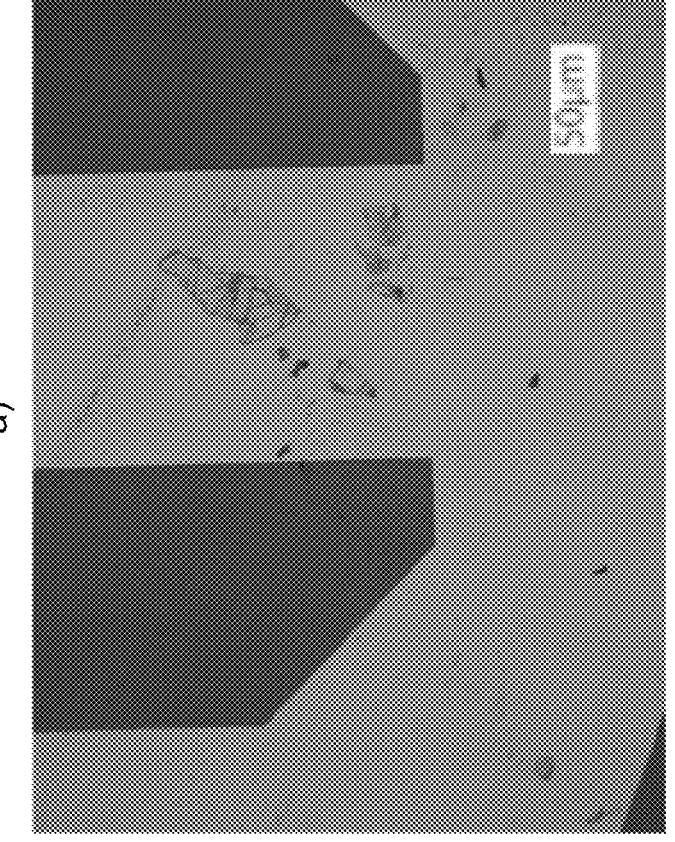
FIG. 14

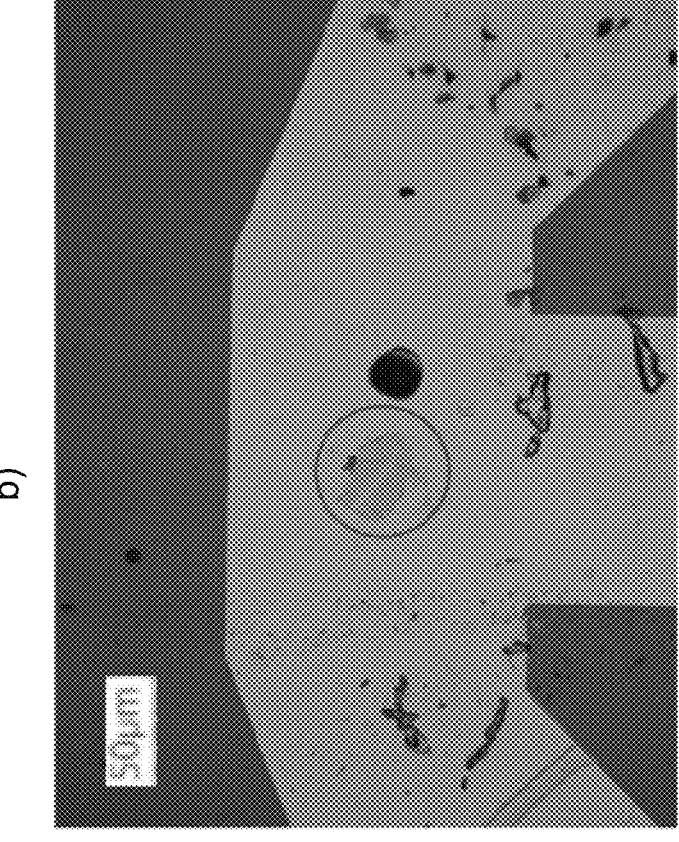
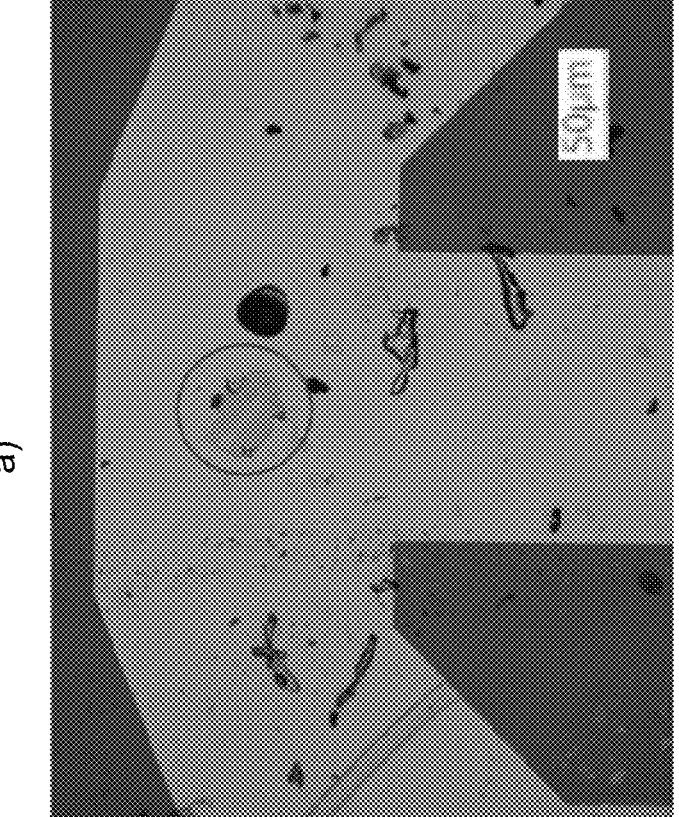
FIG. 15

SYSTEMS AND METHODS FOR FABRICATING A 2D-MATERIAL-BASED QUANTUM SENSOR CHIP

BACKGROUND

Hexagonal Boron Nitride (h-BN) is an example 2D-material that may host quantum boron vacancy ($V_B^-$) defects. These defects may be utilized as quantum magnetometers via optical detection of magnetic resonance (ODMR). Generally, for the device to function properly, optical excitation may be performed in conjunction with microwave excitation, and microwave excitation may be used to create transitions in the quantum levels of the $V_B^-$ defects.

BRIEF SUMMARY OF DISCLOSURE

In one example implementation, a method may include but is not limited to coating a silicon-based material with a first metal material and a second metal material to create a substrate. A multi-layer hexagonal boron nitride (h-BN) may be transferred onto the substrate. A protective film may be coated on a layer of the multi-layer h-BN. The layer of the multi-layer h-BN may be irradiated for defect generation in the layer of the multi-layer h-BN. An active region of the substrate may be etched. Resist of the substrate may be removed. Contact pads may be created for the substrate. A layer of the first metal material and the second metal material may be coated on the substrate. Additional resist of the substrate may be removed. The substrate may be cut into a plurality of smaller substrates, wherein each smaller substrate of the plurality of smaller substrates includes a h-BN based quantum magnetometer.

One or more of the following example features may be included. The multi-layer h-BN may be heated on the substrate. Removing resist of the substrate may include ion etching and sonification. Crosses on the substrate may be aligned. Creating the contact pads for the substrate may include a second step etching of the substrate. Removing the additional resist of the substrate may include ion etching and sonification. The first metal material may include titanium and the second metal material may include gold.

In another example implementation, a computer program product may reside on a computer readable storage medium having a plurality of instructions stored thereon which, when executed across one or more processors, may cause at least a portion of the one or more processors to perform operations that may include but are not limited to coating a silicon-based material with a first metal material and a second metal material to create a substrate. A multi-layer hexagonal boron nitride (h-BN) may be transferred onto the substrate. A protective film may be coated on a layer of the multi-layer h-BN. The layer of the multi-layer h-BN may be irradiated for defect generation in the layer of the multi-layer h-BN. An active region of the substrate may be etched. Resist of the substrate may be removed. Contact pads may be created for the substrate. A layer of the first metal material and the second metal material may be coated on the substrate. Additional resist of the substrate may be removed. The substrate may be cut into a plurality of smaller substrates, wherein each smaller substrate of the plurality of smaller substrates includes a h-BN based quantum magnetometer.

One or more of the following example features may be included. The multi-layer h-BN may be heated on the substrate. Removing resist of the substrate may include ion etching and sonification. Crosses on the substrate may be aligned. Creating the contact pads for the substrate may include a second step etching of the substrate. Removing the additional resist of the substrate may include ion etching and sonification. The first metal material may include titanium and the second metal material may include gold.

In another example implementation, a substrate may include but is not limited to a silicon-based material coated with a first metal material and a second metal material. The substrate may further include a multi-layer hexagonal boron nitride (h-BN) transferred onto the substrate. The substrate may further include a protective film coated on a layer of the multi-layer h-BN. The substrate may further include the layer of the multi-layer h-BN irradiated for defect generation in the layer of the multi-layer h-BN. The substrate may further include an etched active region of the substrate. The substrate may further include resist of the substrate removed. The substrate may further include contact pads created for the substrate. The substrate may further include a layer of the first metal material and the second metal material coated on the substrate. The substrate may further include additional resist of the substrate removed. The substrate may be cut into a plurality of smaller substrates, wherein each smaller substrate of the plurality of smaller substrates includes a h-BN based quantum magnetometer.

One or more of the following example features may be included. The multi-layer h-BN may be heated on the substrate. Removing resist of the substrate may include ion etching and sonification. Crosses on the substrate may be aligned. Creating the contact pads for the substrate may include a second step etching of the substrate. Removing the additional resist of the substrate may include ion etching and sonification. The first metal material may include titanium and the second metal material may include gold.

The details of one or more example implementations are set forth in the accompanying drawings and the description below. Other possible example features and/or possible example advantages will become apparent from the description, the drawings, and the claims. Some implementations may not have those possible example features and/or possible example advantages, and such possible example features and/or possible example advantages may not necessarily be required of some implementations.

BRIEF DESCRIPTION OF THE DRAWINGS

FIG. 3 is an example diagrammatic view of two optical images of an h-BN flake according to one or more example implementations of the disclosure;

FIG. 5 is an example diagrammatic view of design simulations according to one or more example implementations of the disclosure;

FIG. 7 is an example flowchart of a fabrication process according to one or more example implementations of the disclosure;

3

Figure 9:
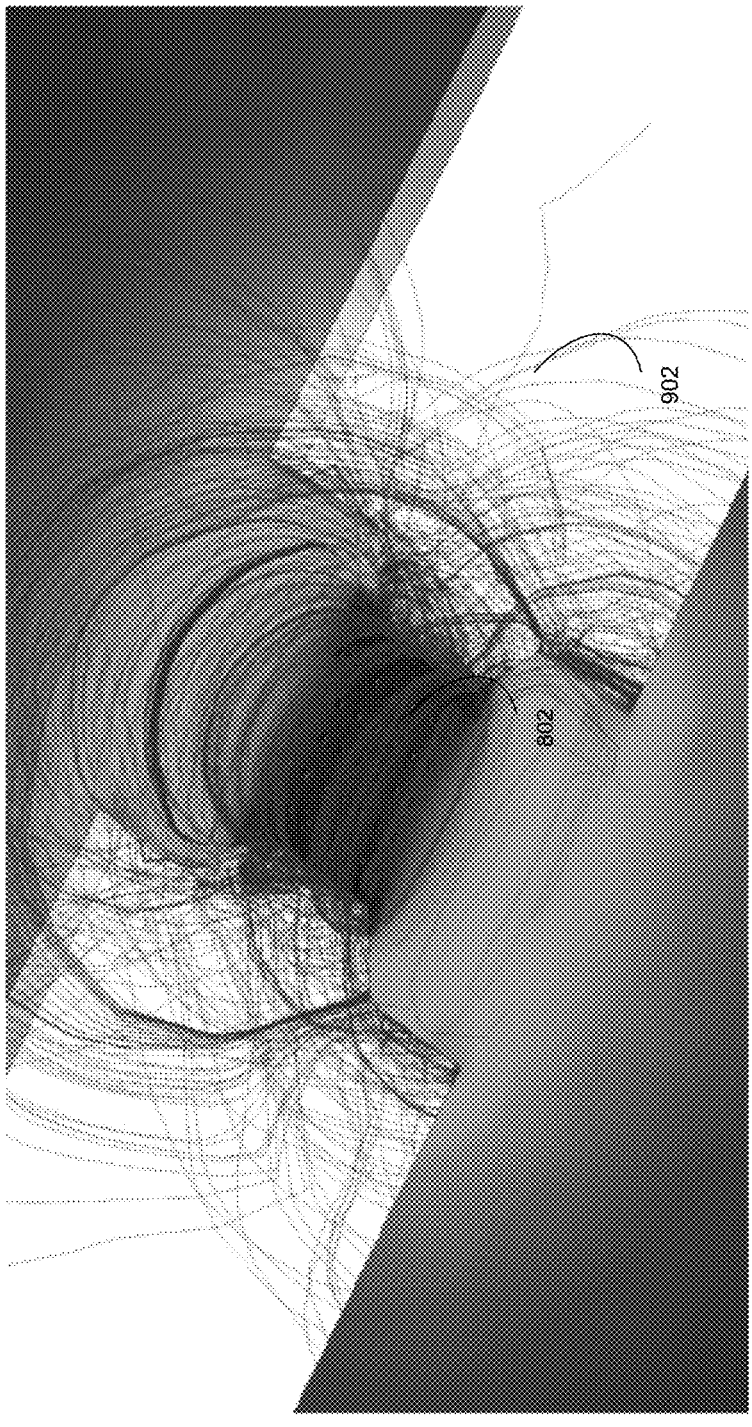
Figure 10:
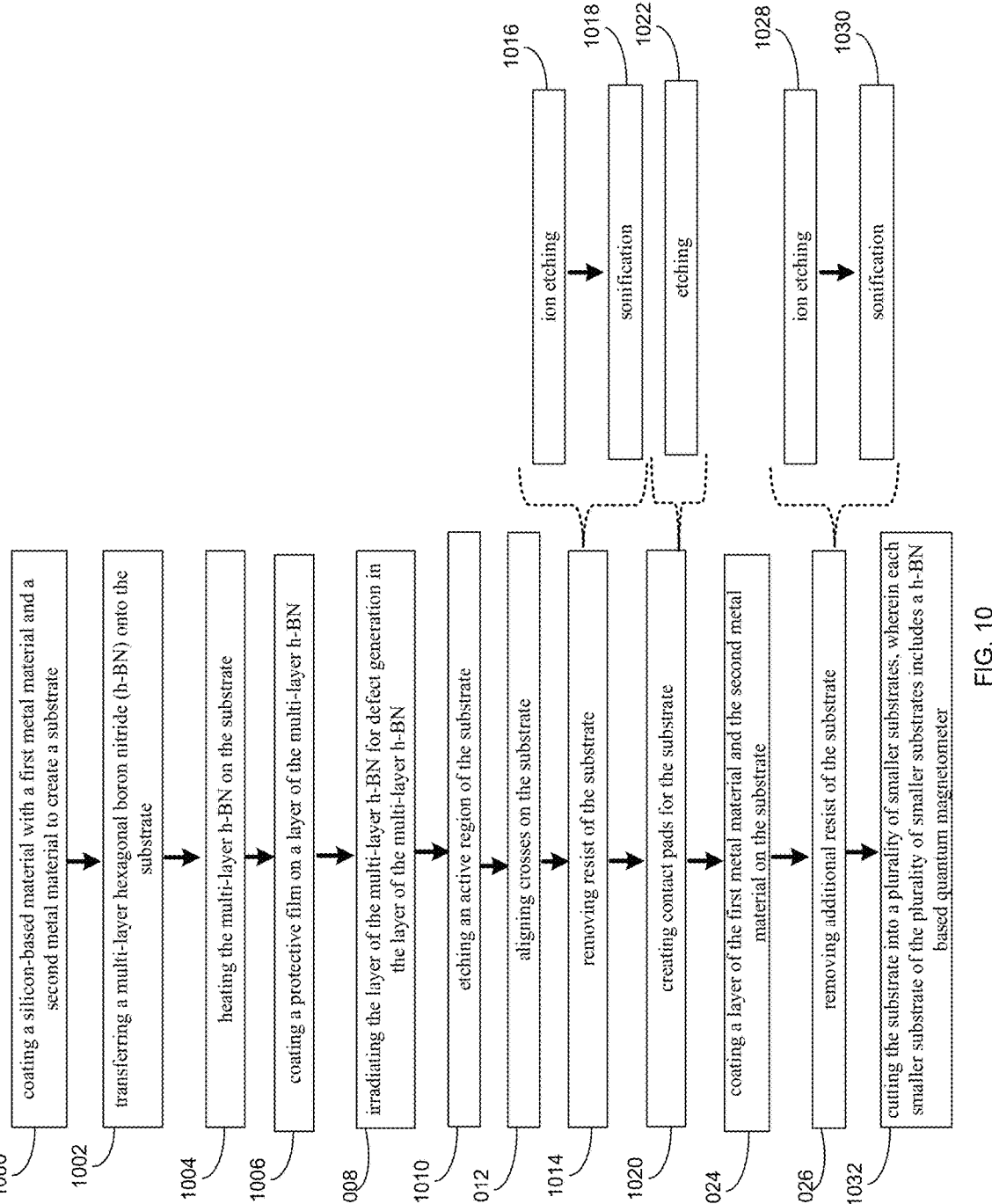
Figure 11:
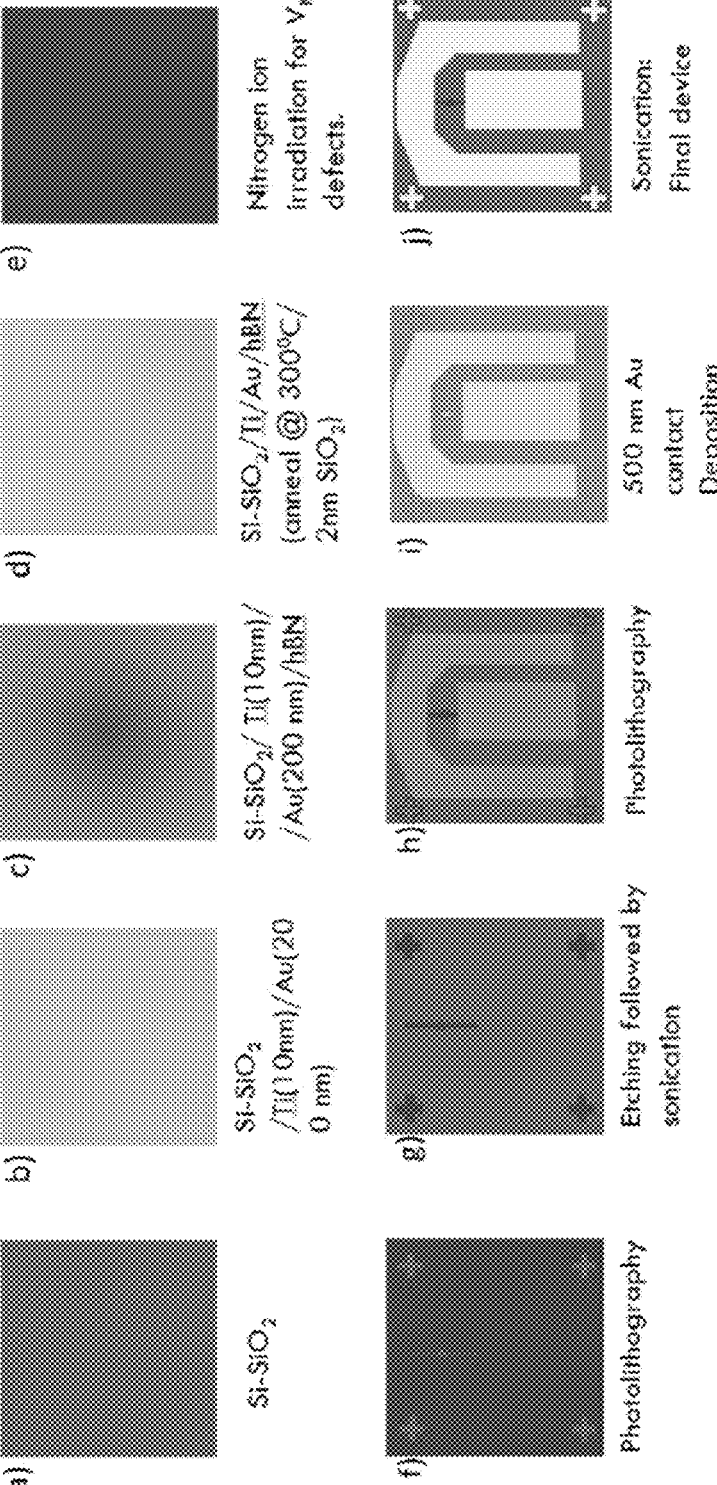

FIG. 8 is an example diagrammatic view of a schematic using a sensor chip according to one or more example implementations of the disclosure;

FIG. 9 is an example diagrammatic view of design simulations according to one or more example implementations of the disclosure;

FIG. 10 is an example flowchart of a fabrication process according to one or more example implementations of the disclosure;

FIG. 11 is an example diagrammatic view of a flowchart of a fabrication process according to one or more example implementations of the disclosure;

FIG. 12 is an example diagrammatic view of two optical images of dry transfers of an h-BN flake according to one or more example implementations of the disclosure;

FIG. 13 is an example diagrammatic view of two optical images of dry transfers of an h-BN flake according to one or more example implementations of the disclosure;

FIG. 14 is an example diagrammatic view of two optical images of unannealed h-BN according to one or more example implementations of the disclosure; and FIG. 15 is an example diagrammatic view of two optical images of annealed h-BN according to one or more example implementations of the disclosure.

Like reference symbols in the various drawings may indicate like elements.

DETAILED DESCRIPTION

System Overview:

Hexagonal Boron Nitride (h-BN) is an example 2D-material that may host quantum boron vacancy ($V_B^-$) defects. These defects may be utilized as quantum magnetometers via optical detection of magnetic resonance (ODMR). Generally, for the device to function properly, optical excitation may be performed in conjunction with microwave excitation, and microwave excitation may be used to create transitions in the quantum levels of the $V_B^-$ defects. In most cases, cavity-based microwave excitation is used to inject microwaves into an optically quantum active h-BN, and the whole device is usually bulky, which limits its applications. Current ODMR technology relies mainly on cavity based, or through-line based microwave injection. The cavity-based technique is bulky, whereas through-line based geometry has impedance variation with frequency. Therefore, as will be discussed in greater detail below, the present disclosure describes performing the same or similar operations on an elegant, miniaturized chip that provides high Radio Frequency (RF) magnetic field concentration, and greater impedance stability over a range of frequencies. This may be accomplished, at least in part, by integration of a 2D material onto a chip (e.g., sensor chip), with the use of a constricted gold shorted co-planar waveguide (CPW), which may be fabricated on the chip itself (on-chip integration). When used for sensing of magnetic fields (e.g., miniaturized quantum sensing of magnetic fields), the sensor chip may be placed very close to the sample and may provide high resolution, precision, and accuracy for detection of magnetic fields and temperatures. Example magnetic sensing applications may include but are not limited to bio-magnetism, magnetic markers in molecules, magnetic domains in materials, etc. The on-chip functionality will make the device portable and easy to integrate in circuits. Simulated results demonstrate the effectiveness of this miniature device with on-chip integration. Advantageously, this process may also be scaled up to for mass fabrication of devices on the wafer scale.

Additionally, in some implementations, as will be discussed further below, the present disclosure may integrate nano-pillars (e.g., gold nano-pillars) onto the constricted shorted CPW geometry, to achieve plasmonic enhancement and on-chip microwave injection on a single chip. Generally, defects in h-BN may be created via bulk ion-irradiation; however, this does not allow for creation of deterministic defects. Inducing strain at certain areas of h-BN deterministically may create defects at those sites. Therefore, as will be discussed in greater detail below, using an array of nano-pillars, the present disclosure may enable the control of the spatial strain regions of h-BN and correspondingly, create deterministic defects. Further, since the nano-pillars may be made of gold, they may add an additional signal enhancement via plasmonic resonance. An array of known defect sites with high signal may add a spatial magnetic field sensing component in this technology.

As noted above, microwave excitation may be used to create transitions in the quantum levels of the VB- defects. These defects may be utilized as quantum magnetometers. However, some devices that utilize h-BN generally use dry transfer method, which is slow and time consuming and cannot be upscaled to mass produce chips (e.g., they must be made one at a time). Further, the dry transfer method has the drawback of being a one-time use only device as the sample to be measured, once placed on the h-BN, cannot be removed without removing h-BN as well. Therefore, as will be discussed in greater detail below, the present disclosure may solve both of these problems i.e., standardized chip fabrication and reusability of the chips, to standardize mass production of reusable devices incorporating h-BN onto gold layers.

In some implementations, the present disclosure may be embodied as a method, system, or computer program product, e.g., via a fabrication process, such as fabrication process 10. Accordingly, in some implementations, the present disclosure (e.g., via fabrication process 10) may take the form of an entirely hardware implementation, an entirely software implementation (including firmware, resident software, micro-code, etc.) or an implementation combining software and hardware aspects that may all generally be referred to herein as a "circuit," "module" or "system." Furthermore, in some implementations, the present disclosure (e.g., via fabrication process 10) may take the form of a computer program product on a computer-usable storage medium having computer-usable program code embodied in the medium. Furthermore, in some implementations, the present disclosure (e.g., via fabrication process 10) may take the form of human actions, or a combination of human, hardware/software, computer program product actions. In some implementations, the hardware/software, computer program product actions may be executed on equipment commonly used in the semiconductor industry. For example, regarding simulation of the RF (radio frequency) characteristics, a variety of RF simulation software may be used, including but not limited to COMSOL, MATlab, Altium etc. Designing of the device may be done in a variety of computer aided design (CAD) software, such as AutoCAD, solidworks, etc. For fabrication, various equipment may be involved. Some of the more important ones being physical vapor deposition systems (e.g., magnetron sputtering, e-beam evaporation, etc. to deposit the metallic or insulating layers and for ion etching), spin coaters for coating of resist layers, laser writers and UV (ultraviolet) lithography machines for the lithography steps, scanning electron microscopes/optical microscopes for imaging and characterization, etc.

In some implementations, any suitable computer usable or computer readable medium (or media) may be utilized. The computer readable medium may be a computer readable signal medium or a computer readable storage medium. The computer-usable, or computer-readable, storage medium (including a storage device associated with a computing device or client electronic device) may be, for example, but is not limited to, an electronic, magnetic, optical, electromagnetic, infrared, or semiconductor system, apparatus, device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a digital versatile disk (DVD), a static random access memory (SRAM), a memory stick, a floppy disk, a mechanically encoded device such as punch-cards or raised structures in a groove having instructions recorded thereon, a media such as those supporting the internet or an intranet, or a magnetic storage device. Note that the computer-usable or computer-readable medium could even be a suitable medium upon which the program is stored, scanned, compiled, interpreted, or otherwise processed in a suitable manner, if necessary, and then stored in a computer memory. In the context of the present disclosure, a computer-usable or computer-readable, storage medium may be any tangible medium that can contain or store a program for use by or in connection with the instruction execution system, apparatus, or device.

In some implementations, a computer readable signal medium may include a propagated data signal with computer readable program code embodied therein, for example, in baseband or as part of a carrier wave. In some implementations, such a propagated signal may take any of a variety of forms, including, but not limited to, electromagnetic, optical, or any suitable combination thereof. In some implementations, the computer readable program code may be transmitted using any appropriate medium, including but not limited to the internet, wireline, optical fiber cable, RF, etc. In some implementations, a computer readable signal medium may be any computer readable medium that is not a computer readable storage medium and that can communicate, propagate, or transport a program for use by or in connection with an instruction execution system, apparatus, or device.

In some implementations, computer program code for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java©, Smalltalk, C++ or the like. Java© and all Java-based trademarks and logos are trademarks or registered trademarks of Oracle and/or its affiliates. However, the computer program code for carrying out operations of the present disclosure may also be written in conventional procedural programming languages, such as the "C" programming language, PASCAL, or similar programming languages, as well as in scripting languages such as Javascript, PERL, or Python. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN), a wide area network (WAN), a body area network BAN), a personal area network (PAN), a metropolitan area network (MAN), etc., or the connection may be made to an external computer (for example, through the internet using an Internet Service Provider). In some implementations, electronic circuitry including, for example, programmable logic circuitry, an application specific integrated circuit (ASIC), field-programmable gate arrays (FPGAs) or other hardware accelerators, micro-controller units (MCUs), or programmable logic arrays (PLAs) may execute the computer readable program instructions/code by utilizing state information of the computer readable program instructions to personalize the electronic circuitry, in order to perform aspects of the present disclosure.

In some implementations, the flowchart and block diagrams in the figures illustrate the architecture, functionality, and operation of possible implementations of apparatus (e.g., systems), methods and computer program products according to various implementations of the present disclosure. Each block in the flowchart and/or block diagrams, and combinations of blocks in the flowchart and/or block diagrams, may represent a human action, module, segment, or portion of code, which comprises one or more executable computer program instructions for implementing the specified logical function(s)/act(s). These computer program instructions may be provided to a processor of a general purpose computer, special purpose computer, or other programmable data processing apparatus to produce a machine, such that the computer program instructions, which may execute via the processor of the computer or other programmable data processing apparatus, create the ability to implement one or more of the functions/acts specified in the flowchart and/or block diagram block or blocks or combinations thereof. It should be noted that, in some implementations, the functions noted in the block(s) may occur out of the order noted in the figures (or combined or omitted). For example, two blocks shown in succession may, in fact, be executed substantially concurrently, or the blocks may sometimes be executed in the reverse order, depending upon the functionality involved.

In some implementations, these computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks or combinations thereof.

In some implementations, the computer program instructions may also be loaded onto a computer or other programmable data processing apparatus to cause a series of operational steps to be performed (not necessarily in a particular order) on the computer or other programmable apparatus to produce a computer implemented process such that the instructions which execute on the computer or other programmable apparatus provide steps for implementing the functions/acts (not necessarily in a particular order) specified in the flowchart and/or block diagram block or blocks or combinations thereof.

2D-Material-Based Quantum Sensor Chip:

As discussed above and referring also at least to the example implementations of FIGS. 1-15, fabrication process 10 may fabricate 100 a sensor chip, wherein the sensor chip may include an adhesion layer, a conduction layer, a signal line, a ground line, and a constriction region. Fabrication process 10 may short 200 the signal line with the ground line in the constriction region.

As will be described below, the present disclosure describes an elegant, miniaturized chip that provides high Radio Frequency (RF) magnetic field concentration, and greater impedance stability over a range of frequencies. This may be accomplished, at least in part, by integration of a 2D material onto a chip (e.g., sensor chip), with the use of a constricted gold shorted co-planar waveguide (CPW), which may be fabricated on the chip itself (on-chip integration). When used for sensing of magnetic fields (e.g., miniaturized quantum sensing of magnetic fields), the sensor chip may be placed very close to the sample and may provide high resolution, precision, and accuracy for detection of magnetic fields and temperatures. Example magnetic sensing applications may include but are not limited to bio-magnetism, magnetic markers in molecules, magnetic domains in materials, etc. The on-chip functionality will make the device portable and easy to integrate in circuits. Simulated results (discussed further below) demonstrate the effectiveness of this miniature device (chip) with on-chip integration. The sensor chip may be excited with microwave energy and a laser simultaneously, and the photoluminescence given off by the device may be measured. The underlying physics is summarized for example purposes only as follows:

Hexagonal Boron Nitride (h-BN) is a 2D-material that can host quantum boron vacancy (VB-) defects. Those defects may be used as quantum magnetometers via, e.g., optical detection of magnetic resonance (ODMR). As will be discussed below, an example feature of the sensor chip is a constricted gold-shorted co-planar waveguide (CPW) that connects (shorts) the signal line of the sensor chip with the ground line. This may provide multiple example and non-limiting benefits, such as higher magnetic-field strength than other designs, and more consistent (nearly constant) impedance across the frequency band of interest (e.g., 2-6 GHz).

In some implementations, fabrication process 10 may fabricate 100 a sensor chip (e.g., sensor chip 200), wherein sensor chip 200 may include a signal line (e.g., signal line 202), a ground line (e.g., ground line 204), a constriction region (e.g., constriction region 206), an adhesion layer (e.g., adhesion layer 205), and a conduction layer (e.g., conduction layer (210). For instance, and referring to the example implementation of FIG. 2, an example design of a shorted and constricted CPW is shown (left), with a zoomed in region within the circle shown on the right. A CPW may generally be described as a type of electrical planar transmission line, which may be fabricated using Printed Circuit Board (PCB) technology, and may be used to convey microwave-frequency signals. When used on a smaller scale, CPW transmission lines may be built into monolithic microwave integrated circuits. In some implementations, as will be discussed further below, constriction region 206 may include a channel (e.g., channel 208) through a portion of signal line 202, and in some implementations, channel 208 may include a first notch (e.g., notch 21 0a) on a first side of the portion of the signal line that is parallel to a second notch (e.g., notch 210b) on a second side of the portion of the signal line.

In some implementations, as will be discussed in further detail below, signal line 202 is the conductive pathway that carries the microwaves (or RF waves, which may be used interchangeably). It is generally a thin strip of gold or other conductive material. Ground line 204 generally refers to the zero potential lines, which are conduction lines connected to the ground. Ground line 204 enables termination of the microwave electric field, resulting in lower noise due to less fringe effects of the fields.

In some implementations, sensor chip 200 may be fabricated on, e.g., a 1×1 cm Si/SiO2 wafer, and the regions shown with diagonal dashed lines may be made of, e.g., Titanium (Ti(20 nm)) adhesion layer/Gold (Au(500 nm)) conduction layer. It will be appreciated that the thickness of Ti may vary For instance, the thickness of Ti may range from, e.g., 5 to 70 nm in general. The thickness of Au may generally be anywhere from, e.g., 20 to 1 micron or more. In general, there is no strict criteria for this, other than that the Au layer should not be thinner than the Ti layer. For conduction and transmission purposes, Au is the industry standard although materials like aluminum or copper may also be used. In a similar vein, Ti is the preferred adhesive layer for Au as it is low cost and effective. However, other metals such as tantalum, chromium, tungsten and aluminum may also be used. In some implementations, the constriction length may be, e.g., 100×50 µms. Notably, there may be several factors for determining the length. In the example, the dimensions have been chosen so that the effective impedance is 50 ohms. As of now, there is no absolute expression to find this direct relation, other than simulating the geometry. Thus, the main point of importance here is the overall impedance, which remains in the range of, e.g., 40-60 ohms. Depending on this, the constriction dimensions may change. As can also be seen in FIG. 2, in the middle there is an additional constriction between notches 210a and 210b (the "region of interest") with a width of, e.g., 30 µm. In some implementations, it may be beneficial to have the notch be less than 100 microns in width. The smaller the thickness, the higher the magnetic field concentration. As such, in some implementations, a good range may be, e.g., from 100 micron to 1 micron. In some implementations, center signal line 202 may be, e.g., 500 µm thick with slot-width of, e.g., 245 µm. The main reason for the notch may be to apply a concentrated magnetic field at a localized and known location of the chip. Thus, by visually seeing the notch, one may place an h-BN flake on this region for sensing purposes. This will help in the reproducibility and standardization of the results.

Figure 1:
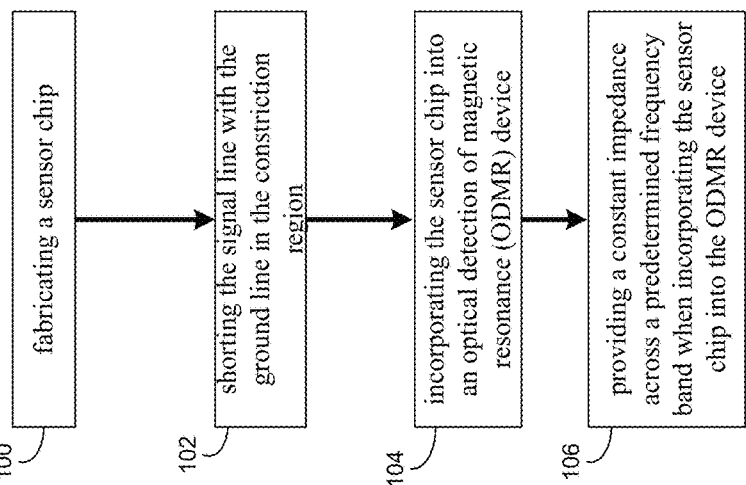
FIG. 1 is an example flowchart of a fabrication process according to one or more example implementations of the disclosure.
Figure 2:
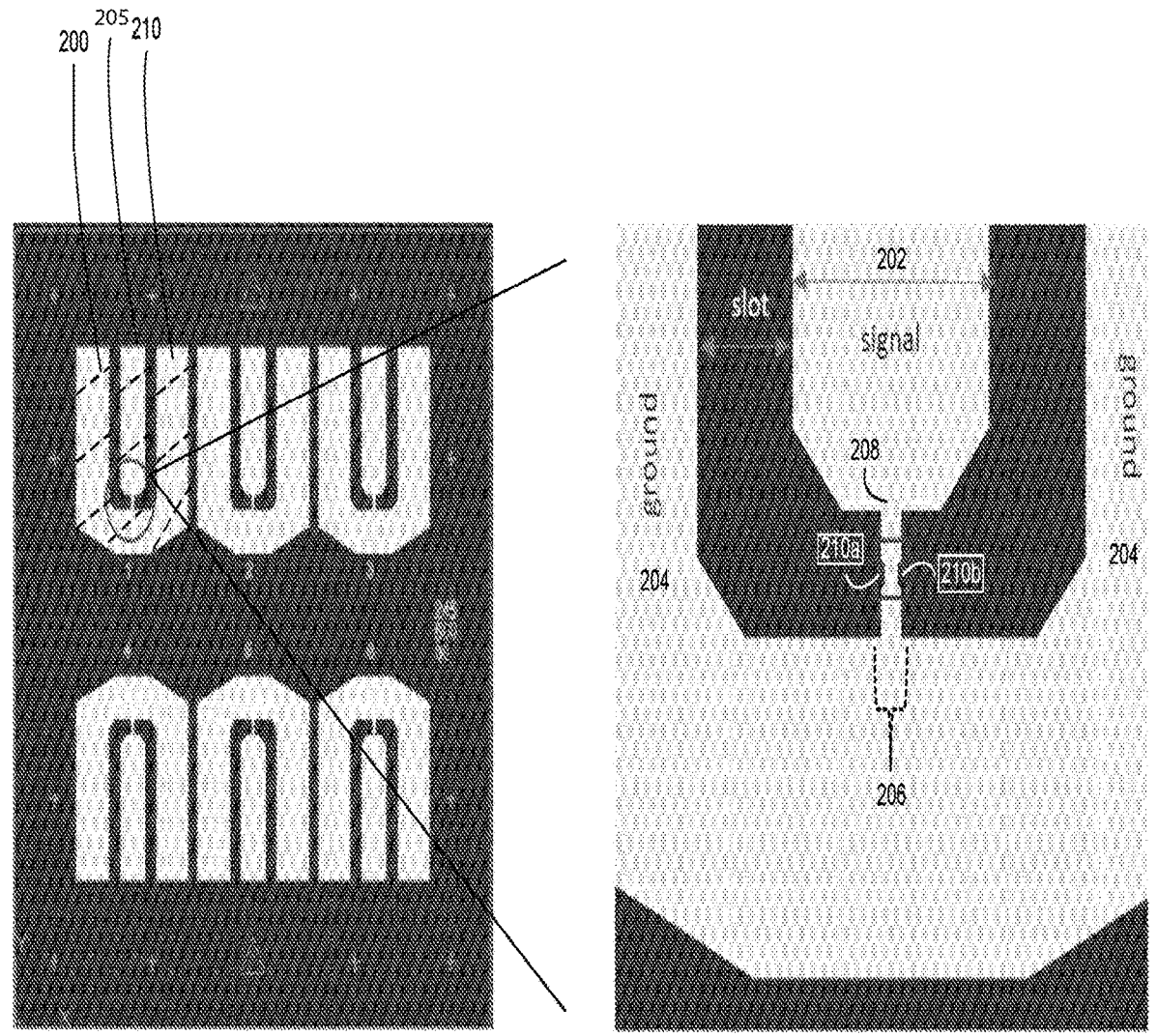
FIG. 2 is an example diagrammatic view of a design of a shorted and constricted CPW according to one or more example implementations of the disclosure.
Figure 4:
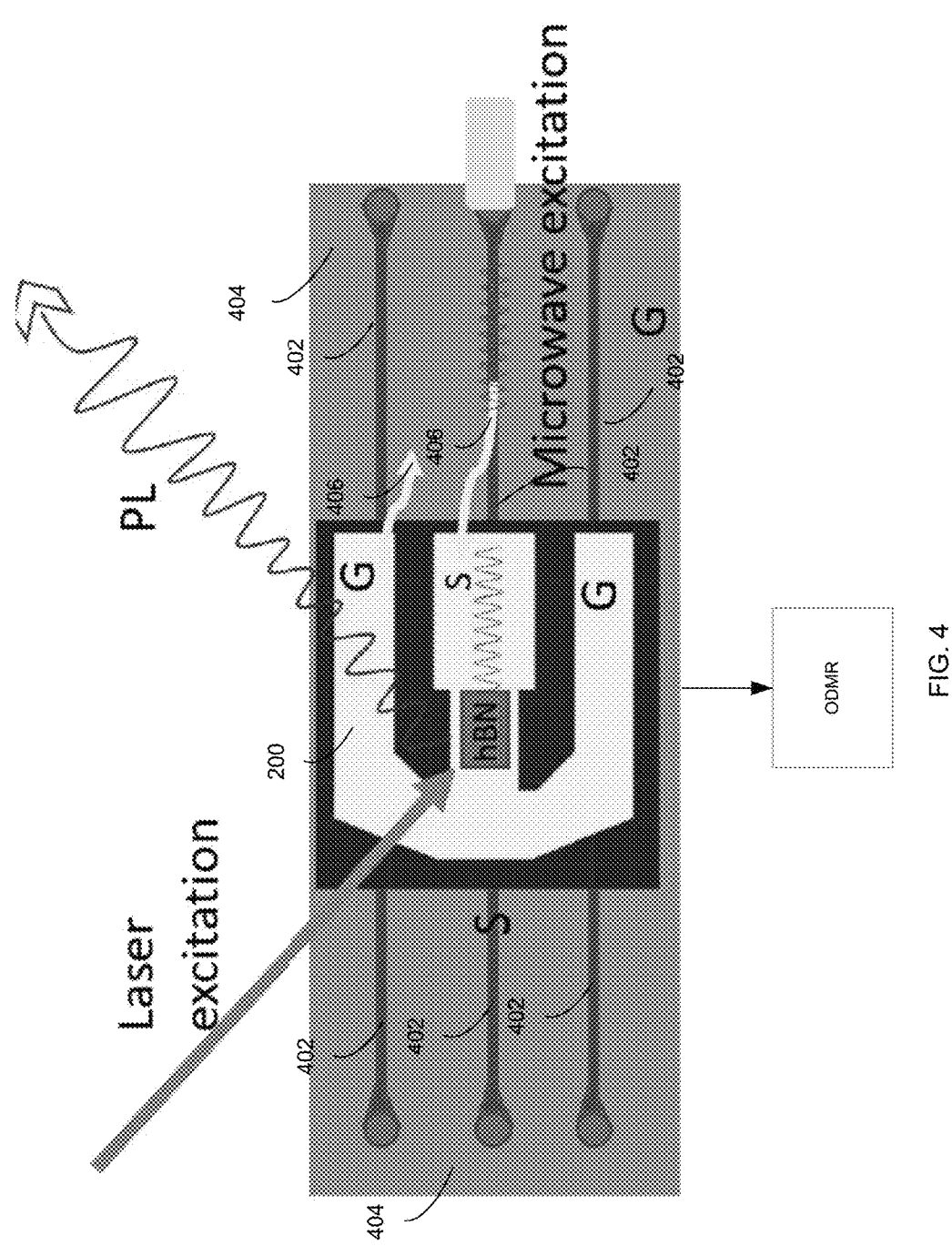
FIG. 4 is an example diagrammatic view of a schematic using a sensor chip according to one or more example implementations of the disclosure.

In some implementations, sensor chip 200 may be fabricated on, e.g., a 500 µm thick Si wafer with 300 nm of dry oxide (SiO2) using standard photolithography and liftoff techniques (or other known fabrication techniques discussed further below). The example FIG. 2 shows a wafer size of 1×1 cm, however, it will be appreciated that the design may be duplicated to accommodate alternative wafer sizes (e.g., 6" in diameter) and then cut into 1×1 cm squares (with each square having its own sensor chip 200). It will be appreciated that any appropriately sized wafers may be used and cut into any number of sized shapes as required by specific designs. As such, the use of a 1×1 cm square or 6" wafer should be taken as example only and not to otherwise limit the scope of the present disclosure. It will also be appreciated that the dimensions, thicknesses, height, etc. of any of the elements described herein may vary depending on the desired characteristics and fine tuning. As such, the specific dimensions, thicknesses, heights, etc. disclosed should be taken as example only and not to otherwise limit the scope of the present disclosure.

In some implementations, sensor chip may be a 2D-material-based quantum sensor chip, and in some implementations, the 2D-material may include hexagonal boron nitride (h-BN) configured to host quantum boron vacancy $(V_{B-})$ defects. For instance, after fabrication, an optically active 2D-material, such as h-BN, may be dry transferred onto the region of interest (e.g., between notches 210a and 210b), which in some implementations may be a 30×30 μm constriction region. It will be appreciated that other 2D-materials may be used without departing from the scope of the present disclosure. For instance, single photon emitters (SPE) have been found in h-BN as well as some transitional metal dichalcogenides (TMDs). However, TMDs may only show this behavior at low temperatures, whereas h-BN and diamond are materials with room temperature SPE. The gold here may serve not only as a conductor for the RF signal, but may also help to plasmonically enhance the photoluminescence (PL) of h-BN. The plasmonic enhancement is shown in the example implementation of FIG. 3. For instance, a) on the left shows the optical image of an h-BN flake on gold, whereas b) on the right shows the PL map. As shown in FIG. 3, it can easily be seen the enhanced PL of h-BN on gold as opposed to SiO2. Generally, the term "flake" may be meant in the literal sense here, basically, a small flat thin piece of h-BN. The thickness of the flake may be arbitrary, ranging from a few nanometers to a few millimeters depending on desired characteristics.

In some implementations, fabrication process 10 may incorporate 104 the sensor chip into an optical detection of magnetic resonance (ODMR) device. Generally, ODMR is a resonance technique that combines optical measurements (PL) with electron spin resonance (ESR). This technique measures transitions between spin sublevels by detecting changes in photoluminescence (PL). The spin resonance part in ODMR is identical to ESR. The only difference is the detection scheme. The ESR technique detects changes in the driving microwave power around the spin resonance frequency, whereas ODMR signals are detected by optical means. For instance, once the h-BN is transferred, the example 1×1 cm sensor chip may be attached to a waveguide carrier PCB. The contact pads may be bonded (e.g., gold wire bonded) to ground 204 and signal 202 lines onto the PCB. In the example, photoluminescence and ODMR experiments on the h-BN flakes may now be performed by simultaneously applying laser excitation and a microwave current from an external source.

In some implementations, fabrication process 10 may short 102 the signal line with the ground line in the constriction region. For instance, and referring at least to the example implementation of FIG. 4, an example schematic 400 using sensor chip 200 is shown. The device (with sensor chip 200) in the center is enlarged to show the h-BN positioning. Microwave current may be pumped in via any acceptable external source. Lines 402 on the PCB show the conduction channels. Ground 404 on the PCB is also shown. Gold wires (arrows 406) may be bonded onto the gold pads of the device to create a shorted ground-signal-ground configuration. A laser is shone on the h-BN flake and the PL signal is collected.

In some implementations, fabrication process 10 may provide 106 a constant impedance across a predetermined frequency band when incorporating the sensor chip into the ODMR device. For instance, notably, based on the present disclosure, there is a miniaturization of the microwave transmission capability, impedance stability over a range of frequencies and large RF magnetic fields at the constriction, which can help in efficient signal detection. To show this, example simulations for the designs are shown in the example FIG. 5. The RF magnetic field for a short-CPW device with a large constriction width a), the constricted short-CPW b), and a popularly used through-line transmission configuration c). The constricted shorted CPW b) shows the highest field strength in the region of interest among all the three geometry types according to the simulations. The scale bars of the same order to show the relative strength of the fields in the three configurations. Frequency used is 3 GHz for all cases in this example, however, it will be appreciated that other frequencies of interest may also be used. The boxes show the region of interest.

Figure 6:
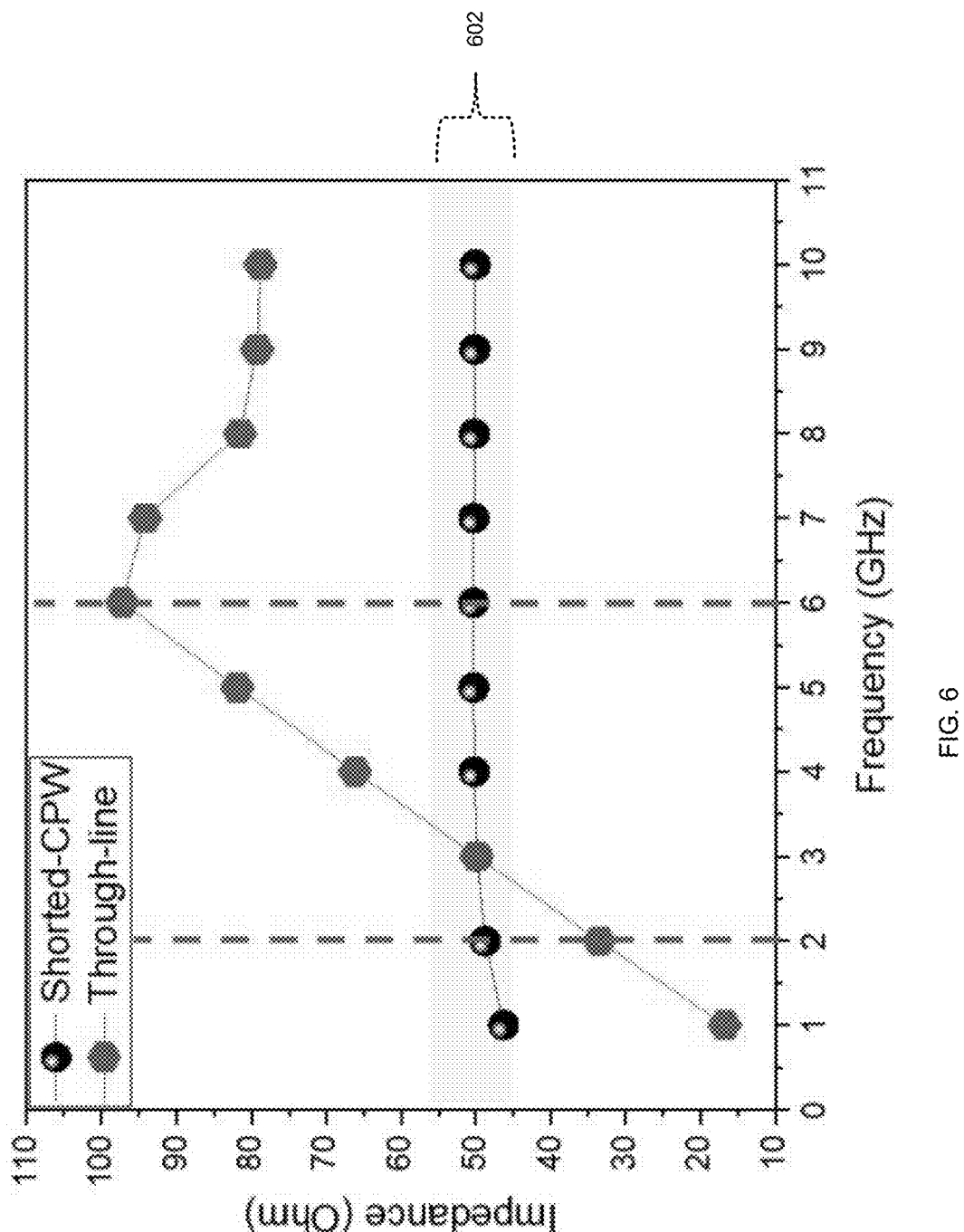
FIG. 6 is an example diagrammatic view of an impedance vs frequency plot according to one or more example implementations of the disclosure.

The short-CPW b) and through-line configurations c) in FIG. 5 show high magnetic fields, which can enable excitation of the h-BN defect quantum levels. Impedance calculations were performed to verify their characteristics as proper waveguides. In some implementations, there may be a requirement for an impedance of 50 Ohm for integration into most circuits, but other impedance levels may be used. FIG. 6 shows the impedance vs frequency plots for b) and c). Unlike the through-line approach, it can be seen that the impedance of the shorted-CPW approach is near constant over a large range of frequencies, especially from 2-6 GHz, which is the example (and non-limiting) working frequency range for functioning of these devices. Example FIG. 6 shows the impedance vs frequency plot 600 with region 602 showing ±10% deviation from 50 Ohm value, while the vertical dotted lines indicate the example working frequency range.

Nano-Pillars:

As discussed above and referring also at least to the example implementations of FIGS. 1-15, fabrication process 10 may fabricate 700 an array of nano-pillars. Fabrication process 10 may transfer 702 a 2D-material on top of the array of nano-pillars. Fabrication process 10 may combine 704 the array of nano-pillars and the 2D-material with a sensor chip, wherein the array of nano-pillars and the 2D-material may be combined with the sensor chip at a constriction region of the sensor chip.

In some implementations, fabrication process 10 may fabricate 700 an array of nano-pillars, and in some implementations, the array of nano-pillars may include an array of gold nano-pillars. For instance, and referring back to FIG. 4, an example schematic 400 using sensor chip 200 is shown. The design of FIG. 4 and the example schematic 800 of FIG. 8 may differ in that there is an array of nano-pillars (e.g., nano-pillars 802 that may be gold and cuboid) with a layer of h-BN on top of it on the area of interest. Similarly to what is described above, once the h-BN is transferred, the example 1×1 cm sensor chip may be attached to a waveguide carrier PCB. The contact pads may be bounded (e.g., gold wire bonded) to ground 204 and signal 202 lines onto the PCB. In the example, photoluminescence and ODMR experiments on the h-BN flakes may now be performed by simultaneously applying laser excitation and a microwave current from an external source. However, the addition of the nano-pillars may create defects due to the strain induced on h-BN via stretching of the h-BN crystals around nano-pillars 802. For instance, quantum emitters in h-BN exhibit different emission energies (ZPL) over a large spectral band due to variations in local strain and dielectric environment. Tuning the quantum emitters through external strain may lead to an increased probability of multiple emitters having the same emission energy.

In some implementations, example fabrication steps similar to those described above may include, e.g.:

1. A thin film of, e.g., 15 nm Ti and 800 nm Au is grown on, e.g., Si—SiO2 (500 nm) substrate.
2. A channel of length, e.g., 150 μm×50 μm with an additional 30×30 μm constriction at the center of the channel may be patterned via, e.g., standard photolithography and etching.

3. On the 30 μm×30 μm constriction, an array of squares of example dimension 200 nm×200 nm and separation of, e.g., 6 μm may be patterned using, e.g., e-beam lithography.

4. Controlled etching of the gold channels up to, e.g., 300 nm Au thickness may result in pillars of example dimensions 500×200×200 nm.

5. Ti(15 nm)/Au(500 nm) contact pads may be deposited via, e.g., lift-off photolithography. In some implementations, the signal line may be, e.g., 500 μm wide with slot width of, e.g., 245 μm, which may help maintain an impedance of 50 ohms.

In some implementations, the dimensions of nano-pillars 802 may be h=100-500 nm, side=100-400 nm. The pillars may be of any shape in principle, however, cuboid shaped pillars may be easier for lithography fabrication. The pillar side may range from 100 to 400 nm. In some implementations, each nano-pillar of the array of nano-pillars may be equally spaced apart. For instance, the separation between each pillar may be, e.g., 6 μm. While the separation between them can range from, e.g., 1 to 6 microns, depending on the number of pillars, one can fit in the 30×30 micron notch area. The h-BN flake may be dry transferred on the pillar and used for quantum sensing. The microwave may be transmitted into the constriction by, e.g., wire-bonding the gold pads onto the carrier waveguide PCB, similar to FIG. 4. It will be appreciated that the disclosed dimensions of the nano-pillars are for example purposes only and not to otherwise limit the scope of the present disclosure.

In some implementations, fabrication process 10 may transfer 702 a 2D-material on top of array of nano-pillars 802 and in some implementations, fabrication process 10 may combine 704 array of nano-pillars 802 and the 2D-material with a sensor chip (e.g., sensor chip 200), wherein array of nano-pillars 802 and the 2D-material may be combined with sensor chip 200 at a constriction region (e.g., region 206 between notch 210a and notch 210b) of sensor chip 200. For instance, after fabrication, the 2D-material (e.g., which may include hexagonal boron nitride (h-BN) or other suitable 2D-material), may be dry (or wet) transferred onto the region of interest, which in the example is the gold nano-pillar array in the 30 μm×30 μm constriction region between the above-noted notches. As noted above, the gold here may serve not only as a conductor for the RF signal, but also helps to plasmonically enhance the photoluminescence of h-BN.

In some implementations, fabrication process 10 may irradiate 710 the 2D-material with a plurality of ions to create deterministic defects where the 2D-material stretches over array of nano-pillars 802. For example, once the h-BN has been transferred on top of the pillars, it may be irradiated with, e.g., He ions or Nitrogen ions. This may create deterministic defects at the places where the h-BN stretches over nano-pillars 802. In some implementations, and as similarly described above, fabrication process 10 may incorporate 706 sensor chip 200 combined with array of nano-pillars 802 and the 2D-material into a waveguide carrier PCB, and in some implementations, fabrication process 10 may incorporate 708 sensor chip 200 combined with array of nano-pillars 802 and the 2D-material into an optical detection of magnetic resonance (ODMR) device. For instance, the h-BN flake may be irradiated with the laser (shown in FIGS. 4 and 8) with simultaneous application of microwave pulses and the photoluminescence may be collected for the ODMR. The plasmon enhancement of gold nano-pillars 802 along with deterministic defect generation may aid in high signal throughput. It will be appreciated that other ions and defect techniques may be used without departing from the scope of the present disclosure. For example, defects may be created by a variety of techniques, such as ion implantation, neutron irradiation, laser writing, etc. Defects in h-BN may be created using all these techniques, as well as with a variety of ions (e.g., Gallium, Argon, Xenon, Oxygen, Ozone, Nitrogen, Helium).

Referring to the example implementation of FIG. 9, an example simulation 900 of the field distribution and field lines for the constricted geometry with nano-pillars at 3 GHz is shown. In the example, the magnetic field in this device is strong and reaches the nano-pillars. In the example, the maximum magnetic field is 4023.32 A/m at the center of the constriction (over the nano-pillars). The nano-pillars are covered by the magnetic field lines 902, which shows that the h-BN sample will experience the RF magnetic field. Thus, the h-BN placed on top of the nano-pillars will be affected by the RF magnetic field, which can effectively excite the quantum levels in the $V_B^-$ defects. The impedance of this device remains constant at 50 ohms over a range of frequencies as shown in FIG. 6.

Therefore, the present disclosure describes an on-chip shorted coplanar waveguide with gold nano-pillars and h-BN. The h-BN layer on top of the gold nano-pillars helps to create the atomic defect. Gold nano-pillars may be integrated onto a constricted shorted co-planar waveguide geometry to achieve plasmonic enhancement and on-chip microwave injection on a single chip.

Fabrication Process:

As discussed above and referring also at least to the example implementations of FIGS. 1-15, fabrication process 10 may coat 1000 a silicon-based material with a first metal material and a second metal material to create a substrate. Fabrication process 10 may transfer 1002 a multi-layer hexagonal boron nitride (h-BN) onto the substrate. Fabrication process 10 may coat 1006 a protective film on a layer of the multi-layer h-BN. Fabrication process 10 may irradiate 1008 the layer of the multi-layer h-BN for defect generation in the layer of the multi-layer h-BN. Fabrication process 10 may etch 1010 an active region of the substrate. Fabrication process 10 may remove 1014 resist of the substrate. Fabrication process 10 may create 1020 contact pads for the substrate. Fabrication process 10 may coat 1024 a layer of the first metal material and the second metal material on the substrate. Fabrication process 10 may remove 1026 additional resist of the substrate. Fabrication process 10 may cut 1032 the substrate into a plurality of smaller substrates, wherein each smaller substrate of the plurality of smaller substrates includes a h-BN based quantum magnetometer.

Unlike current h-BN based quantum magnetometer-on-chip sensors that use a dry transfer method for placing a h-BN flake on a substrate/chip, which is relatively slow, time consuming, not suited for on-chip sensor mass production, and which results in an h-BN flake placed on a chip being removed from the chip after a given sensor is used (making known h-BN based quantum magnetometer-on-chip sensors one-time sensors), the present disclosure describes a fabrication method that allows for mass production of re-useable h-BN based quantum magnetometer-on-chip sensors. An overview of a fabrication process (e.g., fabrication process 10) is shown in the example implementation of FIGS. 10-11. The process may be used for single or mass fabrication of reusable h-BN devices, such as those described throughout. In the example, the process shows at FIG. 11 a schematic of the processes to make a 1×1 cm chip with a single device, which may be scaled to, e.g., 6" wafers as well. It will be appreciated that the fabrication process of sensor chip 200 may include the above-noted nano-pillar design, or may exclude the nano-pillar design.

In some implementations, fabrication process 10 may coat 1000 a silicon-based material with a first metal material and a second metal material to create a substrate, and in some implementations, the first metal material may include titanium and the second metal material may include gold. For instance, as shown in FIG. 11's a) and b), fabrication process 10 may sputter coat 6" Si—SiO2(native oxide 500 nm) with 10 nm Ti and 200 nm Au. It will be appreciated that the use of titanium and gold, as well as their respective thickness of deposition, should be taken as example only and not to otherwise limit the scope of the present disclosure. That is, other materials and thickness may be used to accomplish the goals discussed throughout. Similarly, it will be appreciated that Si—SiO2(native oxide 500 nm) should be taken as example only and not to otherwise limit the scope of the present disclosure. That is, other materials and thickness may be used as the substrate to accomplish the goals discussed throughout.

Sputter deposition (or magnetron sputtering), may be described generally as a physical vapor deposition (PVD) method of thin film deposition by the phenomenon of sputtering. This generally involves ejecting material from a "target" via energetic Argon ions that is a source onto a "substrate" such as a silicon wafer. This may provide a large area of high-quality films. A wide variety of metals and oxides may be prepared through this method. For h-BN deposition, rigorous optimization may be beneficial to deposit the hexagonal crystalline phase on a given target.

While sputter coating is described in this example, it will be appreciated that any appropriate technique used in the semiconductor industry may be used for any of the appropriate steps described throughout without departing from the scope of the present disclosure. For example, Chemical Vapor Deposition (CVD) may also be used, which may generally be described as a vacuum deposition method used to produce large area, high quality, and high-performance, solid materials. The process may be used in the semiconductor industry to produce thin films. In typical CVD, the wafer (substrate) is exposed to one or more volatile precursors, which react and/or decompose on the substrate surface to produce the desired deposit. Frequently, volatile by-products are also produced, which are removed by gas flow through the reaction chamber. In this technique, rigorous optimization may be beneficial to deposit hexagonal crystal phase of boron nitride on a desired substrate.

As another example, Atomic Layer Deposition (ALD) may also be used, which may generally be described as a thin-film deposition technique based on the sequential use of a gas-phase chemical process; it is a subclass of chemical vapor deposition. Most ALD reactions use two chemicals called precursors (also called "reactants"). These precursors react with the surface of a material one at a time in a sequential, self-limiting, manner. A thin film is slowly deposited through repeated exposure to separate precursors. This may be used to produce high quality atomically smooth hBN layers, however, rigorous optimization may be beneficial to achieve this on a given substrate. As such, the use of sputtering should be used as example only, and not to otherwise limit the scope of the present disclosure.

In some implementations, fabrication process 10 may transfer 1002 a multi-layer hexagonal boron nitride (h-BN) onto the substrate. For instance, as shown in FIG. 11's c), fabrication process 10 may use a wet transfer of commercially provided 6"×6" multilayer h-BN on the Au coated substrate. Wet transfer may generally be described as first a spin coat PMMA (poly methyl methacrylate) or similar resist on top of h-BN in a commercially available Cu/h-BN sample. The Cu may then be dissolved in ammonium persulfate solution leaving only hBN-PMMA on the surface of the solution. This is then scooped up via a glass slide, cleaned, and subsequently transferred onto the desired final substrate and the PMMA is cleaned. This may be beneficial for controlled atomic layer and multilayer transfers over large areas. It will be appreciated that alternative or varied approaches similar to the spirit of wet transfer may be used without departing from the scope of the present disclosure.

While wet transfer is described in this example, it will be appreciated that any appropriate technique used in the semiconductor industry may be used for any of the appropriate steps described throughout without departing from the scope of the present disclosure. For example, a dry transfer may also be used. Dry transfer may generally be described as having a commercially available h-BN picked up from the provided substrate via an adhesive tape, which may be pressure sensitive or temperature sensitive. The films may then be transferred onto a PMMA stamp by applying heat or pressure, which is then transferred to the desired substrate. Alternatively, the hBN from the adhesive tape may be directly transferred onto the desired substrate. This may be beneficial for local transfer of multilayer hBN. Generally, monolayer hBN cannot be transferred by this method. As such, the use of wet or dry transferring should be used as example only, and not to otherwise limit the scope of the present disclosure.

In some implementations, fabrication process 10 may heat 1004 the multi-layer h-BN on the substrate. For instance, as shown in FIG. 11's d), fabrication process 10 may anneal at, e.g., 300° C. to 800° C. for strong adhesion of the h-BN on gold. It will be appreciated that any temperature capable of providing an adequate adhesion of the h-BN on gold may be used without departing from the scope of the present disclosure.

In some implementations, fabrication process 10 may coat 1006 a protective film on a layer of the multi-layer h-BN. For instance, as also shown in FIG. 11's d), fabrication process 10 may sputter, e.g., 2-5 nm of protective SiO2 thin films. As noted above, the use of sputtering and a 2-5 nm thickness should be used as example only, and not to otherwise limit the scope of the present disclosure.

In some implementations, fabrication process 10 may irradiate 1008 the layer of the multi-layer h-BN for defect generation in the layer of the multi-layer h-BN. For instance, as shown in FIG. 11's e), fabrication process 10 may use nitrogen irradiation of the films for generation of defects at a dose of, e.g., $3 \times 10^{16}$ ions/cm$^2$. However, it will be appreciated that other ion irradiation, as well as other doses capable of generating the defects, may be used without departing from the scope of the present disclosure.

In some implementations, fabrication process 10 may etch 1010 an active region of the substrate, and in some implementations, fabrication process 10 may align 1012 crosses on the substrate. For instance, as shown in FIG. 11's f), fabrication process 10 may use a photolithography (etching) technique of active region of the devices and align crosses. While photolithography is described in this example, it will be appreciated that any etching technique used in the semiconductor industry may be used for any of the steps described throughout without departing from the scope of the present disclosure.

In some implementations, fabrication process 10 may remove 1014 resist of the substrate, and in some implementations, removing resist of the substrate may include ion etching 1016 and sonication 1018. For instance, as shown in FIG. 11's g), fabrication process 10 may use, e.g., Ar-ion etching followed by, e.g., 10-minutes of low power sonication to remove resists. While Ar-ion etching and sonication are described in this example, it will be appreciated that any etching technique used in the semiconductor industry may be used for any of the steps described throughout without departing from the scope of the present disclosure. Additionally, it will be appreciated that other ions, such as oxygen, chlorine, fluorine and even gallium may also be used without departing from the scope of the present disclosure.

In some implementations, fabrication process 10 may create 1020 contact pads for the substrate, and in some implementations, creating the contact pads for the substrate may include a second step etching 1022 of the substrate. For instance, as shown in FIG. 11's h), fabrication process 10 may use a second step photolithography (or other etching technique) to create the above-described contact pads.

In some implementations, fabrication process 10 may coat 1024 a layer of the first metal material and the second metal material on the substrate. For instance, as shown in FIG. 11's i), fabrication process 10 may use any of the described deposition techniques to apply Ti(15 nm)/Au(500 nm) deposition. It will be appreciated that titanium and gold, as well as their respective thickness of deposition, should be taken as example only and not to otherwise limit the scope of the present disclosure. That is, other materials and thickness may be used to accomplish the goals discussed throughout.

In some implementations, fabrication process 10 may remove 1026 additional resist of the substrate, and in some implementations, removing the additional resist of the substrate may include ion etching 1028 and sonication 1030. For instance, as shown in FIG. 11's j), fabrication process 10 may use sonication to lift off to reveal the final devices. While sonication is described in this example, it will be appreciated that any etching technique used in the semiconductor industry may be used for any of the steps described throughout without departing from the scope of the present disclosure.

In some implementations, fabrication process 10 may cut 1032 the substrate into a plurality of smaller substrates, wherein each smaller substrate of the plurality of smaller substrates includes a h-BN based quantum magnetometer. For instance, the above process may be fabricated on multiple areas of a larger wafer (e.g., a 6" wafer), which may then be cut into, e.g., 1×1 cm squares or into appropriate sizes depending on the dimensions desired. Each square would include one of the sensor chips described throughout.

Therefore, the present disclosure describes a high volume fabrication process for manufacturing h-BN based quantum magnetometer-on-chip sensors that provide enhanced high resolution, precision, and accuracy of magnetic field detection. Unlike current h-BN based quantum magnetometer-on-chip sensors that use a dry transfer method for placing a h-BN flake on a substrate/chip, which is relatively slow, time consuming, not suited for on-chip sensor mass production, and which results in an h-BN flake placed on a chip being removed from the chip after a given sensor is used (making known h-BN based quantum magnetometer-on-chip sensors one-time sensors), the present disclosure describes a fabrication method that allows for mass production of re-useable h-BN based quantum magnetometer-on-chip sensors.

Referring to the example FIG. 12, a dry transfer example is shown. An example problem of dry transferred devices is that they can be removed during the sonication process. For instance, 12 a) and b) show such an issue by comparing the initial a) and final b) result of the dry transferred device on SiO2 upon sonication. 12 a) shows the optical image of the dry transferred h-BN flakes. Upon sonication, the crystals are washed away as shown in 12 b). However, and referring now to FIG. 13, it is possible that, upon annealing in argon atmosphere at 8000 C on SiO2 substrate, the flakes are still retained. For instance, FIG. 13 a) shows the optical image of the dry transferred h-BN flakes, which are annealed at 8000 C on SiO2 in argon. Upon sonication, the crystals remain intact as shown in FIG. 13 b).

Since annealing improved the adhesion of h-BN on SiO2, annealing and sonication of h-BN on gold devices may be performed. The annealing may be done at, e.g., 3000 C for, e.g., 1 hour in argon atmosphere. For instance, FIGS. 14 and 15 show the result of pre (a)) and post (b)) sonication of annealed vs un-annealed h-BN on gold devices. FIG. 14 a) shows sonication of unannealed h-BN on the gold device. FIG. 14 b) shows that after sonication for, e.g., 5 minutes, the h-BN flakes get removed from the yellow gold layer. By contrast, FIG. 15 shows sonication of annealed gold films at 300 C in Ar. 15 a) shows pre sonication, and 15 b) shows post sonication situation. While some smaller flakes have been removed, the main h-BN flake of interest stays in place, as shown in the circled region.

The terminology used herein is for the purpose of describing particular implementations only and is not intended to be limiting of the disclosure. As used herein, the singular forms "a", "an" and "the" are intended to include the plural forms as well, unless the context clearly indicates otherwise. As used herein, the language "at least one of A and B" (and the like) as well as "at least one of A or B" (and the like) should be interpreted as covering only A, only B, or both A and B, unless the context clearly indicates otherwise. It will be further understood that the terms "comprises" and/or "comprising," when used in this specification, specify the presence of stated features, integers, steps (not necessarily in a particular order), operations, elements, and/or components, but do not preclude the presence or addition of one or more other features, integers, steps (not necessarily in a particular order), operations, elements, components, and/or groups thereof.

The corresponding structures, materials, acts, and equivalents (e.g., of all means or step plus function elements) that may be in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications, variations, substitutions, and any combinations thereof will be apparent to those of ordinary skill in the art without departing from the scope and spirit of the disclosure. The implementation(s) were chosen and described in order to explain the principles of the disclosure and the practical application, and to enable others of ordinary skill in the art to understand the disclosure for various implementation(s) with various modifications and/or any combinations of implementation(s) as are suited to the particular use contemplated.

Having thus described the disclosure of the present application in detail and by reference to implementation(s) thereof, it will be apparent that modifications, variations, and any combinations of implementation(s) (including any modifications, variations, substitutions, and combinations thereof) are possible without departing from the scope of the disclosure defined in the appended claims.

17

18

What is claimed is:

1. A method comprising:

coating a silicon-based material with a first metal material and a second metal material to create a substrate;

transferring a multi-layer hexagonal boron nitride (h-BN) onto the substrate;

coating a protective film on a layer of the multi-layer h-BN;

irradiating the layer of the multi-layer h-BN for defect generation in the layer of the multi-layer h-BN;

etching an active region of the substrate;

removing first resist of the substrate;

creating contact pads for the substrate;

coating a layer of the first metal material and the second metal material on the substrate;

removing second resist of the substrate; and cutting the substrate into a plurality of smaller substrates, wherein each smaller substrate of the plurality of smaller substrates includes a h-BN based quantum magnetometer.

2. The method of claim 1 further comprising heating the multi-layer h-BN on the substrate.

3. The method of claim 1, wherein removing at least one of the first resist or the second resist of the substrate includes: ion etching; and sonification.

4. The method of claim 1 further comprising aligning crosses on the substrate.

5. The method of claim 1, wherein creating the contact pads for the substrate includes a second step etching of the substrate.

6. The method of claim 1, wherein removing the second resist of the substrate includes:

ion etching; and sonification.

7. The method of claim 1 wherein the first metal material includes titanium and the second metal material includes gold.

* * * * *